(12) United States Patent
Eaves

(10) Patent No.: US 9,184,795 B2
(45) Date of Patent: Nov. 10, 2015

(54) PACKET ENERGY TRANSFER IN-LINE COMMUNICATIONS

(71) Applicant: VoltServer, Inc., Charlestown, RI (US)

(72) Inventor: Stephen Spencer Eaves, Charlestown, RI (US)

(73) Assignee: VoltServer, Inc., East Greenwich, RI (US)

( * ) Notice: Subject to any disclaimer, the term of this patent is extended or adjusted under 35 U.S.C. 154(b) by 0 days.

(21) Appl. No.: 14/604,836

(22) Filed: Jan. 26, 2015

(65) Prior Publication Data

US 2015/0215001 A1  Jul. 30, 2015

Related U.S. Application Data

(60) Provisional application No. 61/931,678, filed on Jan. 26, 2014.

(51) Int. Cl.
| | |
|---|---|
| *H04B 3/46* | (2015.01) |
| *H04B 3/54* | (2006.01) |
| *G01R 29/027* | (2006.01) |
| *H04L 1/00* | (2006.01) |

(52) U.S. Cl.
CPC .............. *H04B 3/542* (2013.01); *G01R 29/027* (2013.01); *H04L 1/0033* (2013.01)

(58) Field of Classification Search
CPC .............. H04L 1/20; H04L 1/24; H04B 3/46; G06Q 50/06; H02J 3/00
USPC ............... 375/224, 225; 700/21, 79, 286, 295
See application file for complete search history.

(56) References Cited

U.S. PATENT DOCUMENTS

| | | |
|---|---|---|
| 8,781,637 B2 | 7/2014 | Eaves |
| 2009/0187285 A1* | 7/2009 | Yaney et al. .................. 700/292 |
| 2015/0091391 A1* | 4/2015 | Dwelley et al. ............... 307/130 |

* cited by examiner

*Primary Examiner* — Khai Tran

(57) ABSTRACT

Data is communicated between a digital power transmitter and one or more digital power receivers over a transmission line comprising positive and negative conductors. If the transmitter is sending data to the receiver, a first transmitter electrical switch is selectively operated to increase electrical charge in the transmission-line capacitance. If the receiver is sending data to the transmitter, a first receiver electrical switch is selectively operated to increase electrical charge in the transmission-line capacitance.

18 Claims, 4 Drawing Sheets

PACKET ENERGY TRANSFER IN-LINE COMMUNICATIONS

RELATED APPLICATION

This application claims the benefit of U.S. Provisional Application No. 61/931,678, filed 26 Jan. 2014, the entire content of which is incorporated herein by reference.

BACKGROUND

Digital electric power can be characterized as any power format where electrical power is distributed in discrete, controllable units of energy. Packet Energy Transfer (PET) is a new type digital electric power protocol that has been disclosed in U.S. Pat. No. 8,781,637 (Eaves 2012).

The primary discerning factor in a digital power transmission system compared to traditional, analog power systems is that the electrical energy is separated into discrete units, and individual units of energy can be associated with analog and/or digital information that can be used for the purposes of optimizing safety, efficiency, resiliency, control or routing.

As described by Eaves 2012, a source controller and a load controller are connected by power transmission lines. The source controller of Eaves 2012 periodically isolates (disconnects) the power transmission lines from the power source and analyzes, at a minimum, the voltage characteristics present at the source controller terminals directly before and after the lines are isolated. The time period when the power lines are isolated was referred to by Eaves 2012 as the "sample period" and the time period when the source is connected is referred to as the "transfer period". The rate of rise and decay of the voltage on the lines before, during and after the sample period reveal if a fault condition is present on the power transmission lines. Measurable faults include, but are not limited to, short circuit, high line resistance or the presence of an individual who has improperly come in contact with the lines. Eaves 2012 also describes digital information that may be sent between the source and load controllers over the power transmission lines to further enhance safety or provide general characteristics of the energy transfer, such as total energy, or the voltage at the load controller terminals. Since the energy in a PET system is transferred as discrete quantities, or quanta, it can be referred to as "digital power".

Eaves 2012 disclosed the method of modulating and demodulating a communication carrier signal on the same power lines that carry the electrical power. The technique is well known to those skilled in the industry and often referred to as "power line communications", "power line carrier communications" or "carrier current communications". The method disclosed by Eaves 2012 did not identify if the communication would occur during the time when the source and load devices are transferring power (transfer period) or if it would occur during the time when the source is isolated from the transmission lines (sample period).

The present invention discloses a method and apparatus for communication only during the sample period of the digital power waveform. During the sample period, the line is isolated, and there is no interference in the communications stream due to the normal transfer of power from the source to load devices. This provides the opportunity for cost-effective, robust, relatively high rate communications that minimize hardware and software requirements.

Although the present specification is focused on the application of the invention to a digital power transmission system, the disclosed method can be implemented for communication between generic devices without requiring the transfer of power.

SUMMARY

Methods for communicating data between a digital power transmitter and one or more digital power receivers are described herein, where various embodiments of the methods and apparatus for performing the method may include some or all of the elements, features and steps described below.

In a method for communicating data between a digital power transmitter and one or more digital power receivers over a transmission line comprising positive and negative conductors, wherein the transmission line has electrical properties that include at least a finite line-to-line capacitance and at least a finite line-to-line resistance, the method includes: (a) if the transmitter is sending data to the receiver, selectively operating a first transmitter electrical switch to increase electrical charge in the transmission-line capacitance by connecting the transmission line to a transmitter voltage source through a finite resistance or by operating a second transmitter electrical switch to decrease electrical charge by connecting the positive and negative conductors to each other through a finite resistance such that the rate of change in transmission-line voltage alternates between a first voltage slope value and a second voltage slope value, wherein the change in voltage slope is detected and decoded by the receiver to reproduce the data being sent by the transmitter; and (b) if the receiver is sending data to the transmitter, selectively operating a first receiver electrical switch to increase electrical charge in the transmission-line capacitance by connecting the transmission lines to a receiver voltage source through a finite resistance or by operating a second receiver electrical switch to decrease electrical charge by connecting the positive and negative conductors to each other through a finite resistance such that the rate of change in transmission-line voltage alternates between a first voltage slope value and a second voltage slope value, wherein the change in voltage slope is detected and decoded by the transmitter to reproduce the data being sent by the transmitter.

The transmitter voltage source can be connected to the transmission line through a series resistance small enough to cause a rapid increase in transmission-line voltage. The detection of the rapid increase by the transmitter or receiver can be used as a timing reference point for setting the relative times to sample and determine the voltage slope values that signify logic states.

During the time when the receiver is communicating to the transmitter, the transmitter can act to connect the transmission line to the transmitter voltage source through a first resistor value; and the load side can simultaneously connect the transmission-line conductors to each other through a second resistor value, thus forming a voltage divider that creates a third voltage slope value that is detected by the transmitter. Using the analogy of a stop watch, the rapid voltage transition point is where the stopwatch is reset to zero and is used to set the schedule for when activities occur. The activities are "relative" to the reset time on the watch.

The transmitter already knows when the transition happens since it was the one that initiated it, but the receiver must sense the sharp voltage transition on the transmission line to synchronize with the transmitter.

If the transmitter is sending data to the receiver, only one of the two transmitter electrical switches may be implemented such that the rate of change in transmission-line voltage alternates between a first voltage slope value when the one transmitter electrical switch is closed and a second voltage slope value when the one transmitter electrical switch is open, wherein the change in voltage slope can be detected and decoded by the receiver to reproduce the data being sent by the transmitter.

If the receiver is sending data to the transmitter, only one of the two receiver electrical switches may be implemented such that the rate of change in transmission-line voltage alternates between a first voltage slope value when the one receiver electrical switch is closed and a second voltage slope value when the one receiver electrical switch is open, wherein the change in voltage slope can be detected and decoded by the transmitter to reproduce the data being sent by the receiver.

The transmitter or receiver can execute an encoding algorithm for a predetermined number of original data bits to be transmitted, wherein the input to the encoding algorithm is the predetermined number of original bits and the output of the algorithm is a larger number of optimized bits that are chosen to maintain the transmission-line voltage between predetermined upper and lower voltage boundaries, and wherein the optimized bits can then be decoded at the receiver back to the predetermined number of original bits.

The transmitter or receiver can execute an algorithm to calculate the capacitance of the transmission line based on a measurement of the rate of decay of transmission-line voltage and a predetermined value of line-to-line resistance.

The calculated capacitance value of the transmission line and the predetermined line-to-line resistance can be used as inputs to an algorithm to predict the time when the transmission-line voltage will decay to an optimal value for supporting the transmission of data.

The transmitter maintains predetermined acceptable values for transmission-line voltage. Voltages outside of the acceptable values indicate a fault condition, and the transmitter can execute an algorithm to adjust the acceptable values based on the characteristics of the data transmitted from the transmitter to the receiver or from the receiver to the transmitter.

Figure 1:
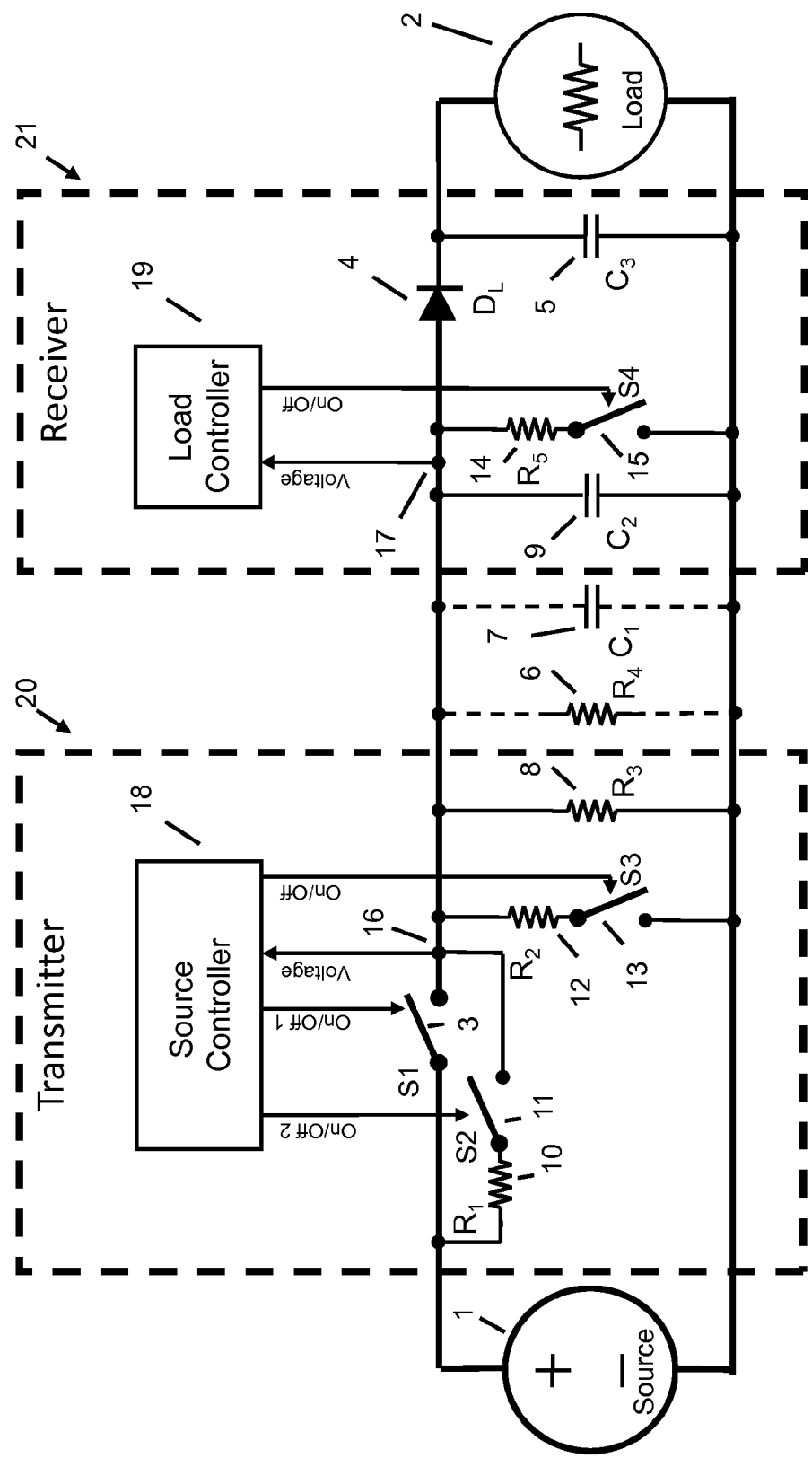
FIG. 1 is an illustration of a representative digital power system.

In the accompanying drawings, like reference characters refer to the same or similar parts throughout the different views; and apostrophes are used to differentiate multiple instances of the same or similar items sharing the same reference numeral. The drawings are not necessarily to scale; instead, emphasis is placed upon illustrating particular principles in the exemplifications discussed below.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise herein defined, used or characterized, terms that are used herein (including technical and scientific terms) are to be interpreted as having a meaning that is consistent with their accepted meaning in the context of the relevant art and are not to be interpreted in an idealized or overly formal sense unless expressly so defined herein. Percentages or concentrations expressed herein can represent either by weight or by volume. Processes, procedures and phenomena described below can occur at ambient pressure (e.g., about 50-120 kPa—for example, about 90-110 kPa) and temperature (e.g., −20 to 50° C.—for example, about 10-35° C.) unless otherwise specified.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to," "coupled to," "in contact with," etc., another element, it may be directly on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Additionally, the various components identified herein can be provided in an assembled and finished form; or some or all of the components can be packaged together and marketed as a kit with instructions (e.g., in written, video or audio form) for assembly and/or modification by a customer to produce a finished product.

A representative digital power system, as originally described in Eaves 2012, is shown in FIG. 1. The system comprises a source 1 and at least one load 2. The PET protocol is initiated by operating switch means 3 to periodically disconnect the source 1 from the power transmission lines. When the switch is in an open (non-conducting) state, the lines are also isolated from any stored energy that may reside at the load 2 by isolation diode ($D_L$) 4.

Eaves 2012 offered several versions of alternative switches that could replace diode ($D_L$) 4 but all versions would have similar results related to the present invention. Capacitor ($C_3$) 5 is representative of an energy storage element on the load side of the circuit.

The transmission lines have inherent line-to-line resistance ($R_4$) 6 and capacitance ($C_1$) 7. The PET system architecture, as described by Eaves 2012, adds additional line-to-line resistance ($R_3$) 8 and capacitance ($C_2$) 9. At the instant switch (S1) 3 is opened, capacitor ($C_1$) 7 and capacitor ($C_2$) 9 have stored charge that decays at a rate that is inversely proportional to the parallel resistance comprising ($R_4$) 6 and ($R_3$) 8. Capacitor ($C_3$) 5 does not discharge through resistor ($R_3$) 8 and resistor ($R_4$) 6 due to the reverse blocking action of diode ($D_L$) 4. The amount of charge contained in capacitor ($C_1$) 7 and capacitor ($C_2$) 9 is proportional to the voltage across them and can be measured at points 16 and 17 by a source controller 18 or load controller 19.

Figure 2:
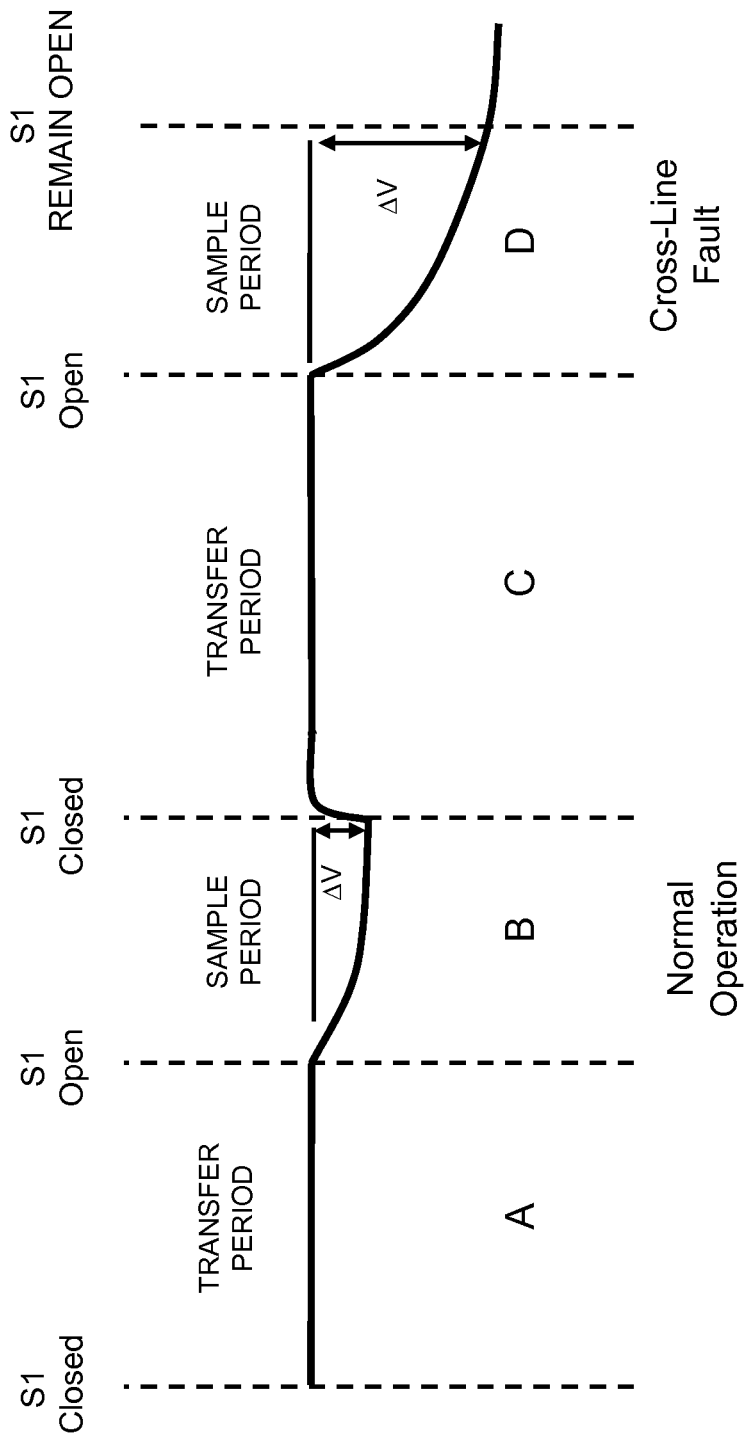
FIG. 2 is a voltage plot showing the difference between normal operation and a fault.

As described in Eaves 2012, a change in the rate of decay of the energy stored in capacitor ($C_1$) 7 and capacitor ($C_2$) 9 can indicate that there is a cross-line fault on the transmission lines. The difference between normal operation and a fault, as presented by Eaves 2012, is illustrated in FIG. 2.

Referring again to FIG. 1, the combination of switch (S1) 3, source controller 18, resistor ($R_1$) 10, switch (S3) 13, and resistor ($R_3$) 8 can be referred to as a transmitter 20. The combination of switch (S4) 15, resistor ($R_5$) 14, load controller 19, diode ($D_L$) 4, capacitor ($C_2$) 9, and capacitor ($C_3$) 5 can be referred to as a receiver 21.

Referring again to FIG. 1, a method is disclosed that exploits the sampling period described in Eaves 2012 as a time to embed communication data on the same transmission lines that are used for power transfer. This is accomplished by modulating the stored charge that is present on capacitor ($C_1$) 7 and on capacitor ($C_2$) 9 during the sampling period.

A simple method is disclosed for modulating the stored charge through a pull-up or pull-down resistor circuit that can add or subtract increments of charge to the transmission line capacitance at high speed. An example of a pull-up circuit is represented by resistor ($R_1$) 10 and switch (S2) 11 of FIG. 1. Pull-down circuits are represented by resistor ($R_2$) 12 and switch (S3) 13 on the transmitter side and resistor ($R_5$) 14 and switch (S4) 15 on the receiver side.

Uni-directional communications is defined as communication only from the transmitter 20 to the receiver 21 or from the receiver to the transmitter. This would require only a single pull-up or pull-down circuit. For uni-directional communication from the transmitter 20 to the receiver 21, the pull-up circuit formed by resistor ($R_1$) 10 and switch (S2) 11 allows the transmitter 20 to embed data on the transmission lines that could then be read by the receiver 21 at load voltage sensing point 17. Alternatively, the pull-down circuit formed by resistor ($R_2$) 12 and switch (S3) 13 also allows the transmitter 20 to embed data on the transmission lines that can then be read by the receiver 21.

For uni-directional communication from the receiver 21 to the transmitter 20, the pull-down circuit formed by resistor ($R_5$) 14 and switch (S4) 15 can be employed to allow the transmitter 20 to detect the data at voltage sensing point 16. The receiver 21 can also use a pull-up circuit rather than a pull-down circuit; but, for simplicity, this option is not shown in the figure.

Since the primary limitation on data transfer rate is the transmission line capacitance the optimal configuration for the fastest data transmission would be to include pull-up and pull-down circuits in both the transmitter 20 and receiver 21 circuitry, but this is a determination to be made on several factors that would include system cost, volume and reliability.

Transmitter Sending a Byte of Data to a Receiver

Figure 5:
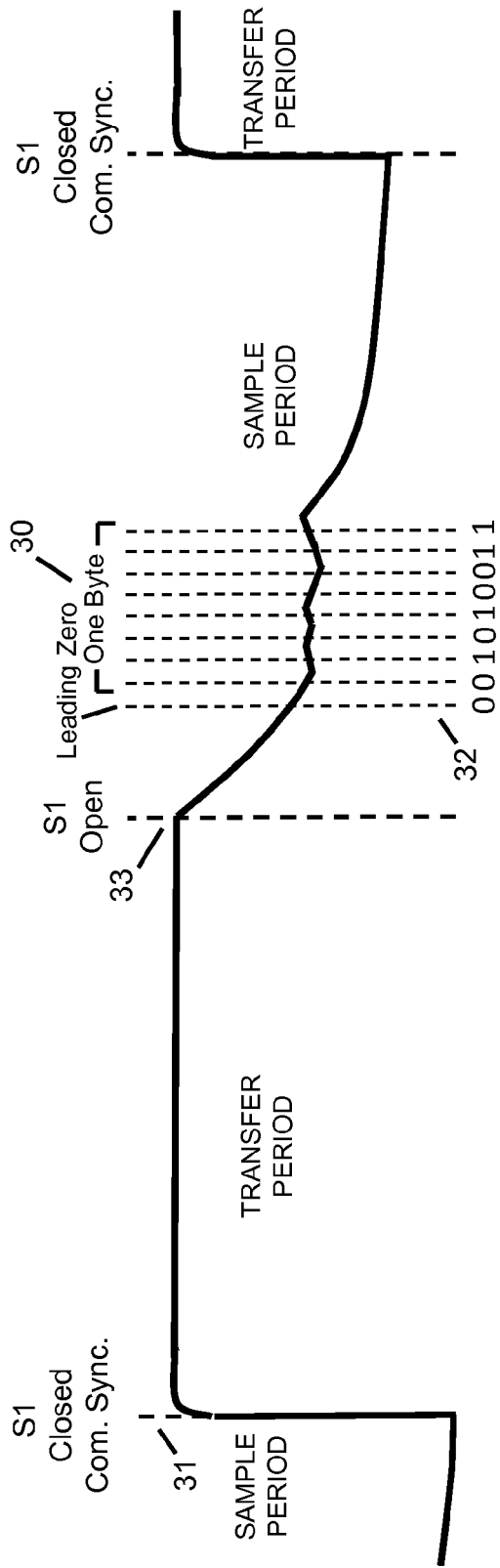
FIG. 5 is a voltage plot showing an embedded byte of data on the transmission lines to be read by the receiver.

The activation of a pull-up or pull-down circuit has the effect of changing the slope of the normal decay rate of the transmission line capacitance. In a particular embodiment, referring to FIG. 1 the pull-up circuit in transmitter 20 comprises resistor ($R_1$) 10 and switch (S1) 11 can be used to embed a byte of data 30 of FIG. 5 on the transmission lines to be read by receiver 21. In FIG. 5, the leading "0" bit 32 is generated by not activating the source side pull-up circuit, resulting in the voltage decay slope continuing unmodified. The zero bit is used to sample the existing slope of decay in the transmission line voltage. Slope calculation can be performed in hardware using differentiator circuits, or it may be performed in software by taking storing a minimum of two consecutive voltage sample and calculating the relative slope between them.

In the next bit period, the pull-up circuit is not activated to generate a logic "0" then a "1" is generated by activating the pull-up circuit. The process of selectively activating or not activating the pull-up circuit continues until the entire byte is transferred by the source side to the load side.

Receiver Circuit Receiving a Byte of Data from the Transmitter

In a particular embodiment, the transmitter 20 receives a byte of data from the receiver 21 by activating its pull-up circuit resistor ($R_1$) 10 and switch (S2) 11 of FIG. 1, while the receiver 21 simultaneously activates its pull-down circuit comprising resistor ($R_5$) 14 and switch (S4) 15 to generate a logic "0". To generate a logic "1", the transmitter 20 activates its pull-up circuit, while the receiver 21 simultaneously does not activate its pull-down circuit.

To determine when to activate the circuits, the data frame is synchronized with the rising edge that occurs at the end of the last sample period 31 of FIG. 5. The source controller 18 of FIG. 1 is inherently aware of the synchronization point since it is the device activating the disconnect switch, but the load controller 19 needs a definitive method to synchronize its data transmission and reception. Rising edge 31 of FIG. 5 is sharp and distinctive because the transmitter 20 of FIG. 1 is at that time directly connecting the source potential to the transmission line with the lowest possible resistance in between in order to maximize efficiency. In a particular embodiment, the load controller 19 through software or hardware detects the large positive change in voltage and steep slope, indicating the end of the sample period and beginning of the next frame of data transmission. The load and source controllers 19 and 18 wait a predetermined time after the synchronization point to embed the first bit of data. Alternatively, a change in voltage at the beginning of the sample period 33 of FIG. 5 can be used as a synchronization point. The voltage slope at point 33 is less distinctive than point 31 but has the advantage of being closer in time to the point where the data will be embedded and thus may be more suitable for processors with less accurate timing capability.

Selecting the Start Time for Data Transmission

Referring to FIG. 5, it should be noted that there is a strategy to selecting the portion of the sample period where the data stream will be embedded on the transmission lines. If the transmission-line voltage during the sample period, as seen on the source side circuitry, is too high or too low, then the slope change caused by activating the pull-up or pull-down circuits on the source side or load side will be smaller and less detectable by the corresponding voltage sensing circuitry in the transmitter 20 or receiver 21.

Figure 3:
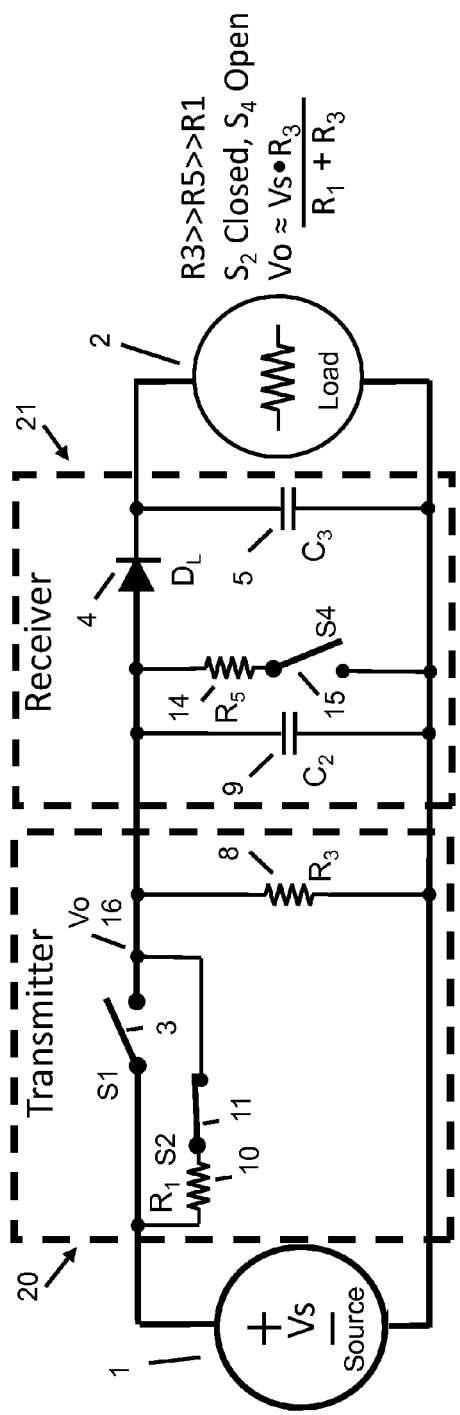
FIG. 3 is an illustration of a digital power system when switch S2 is closed.
Figure 4:
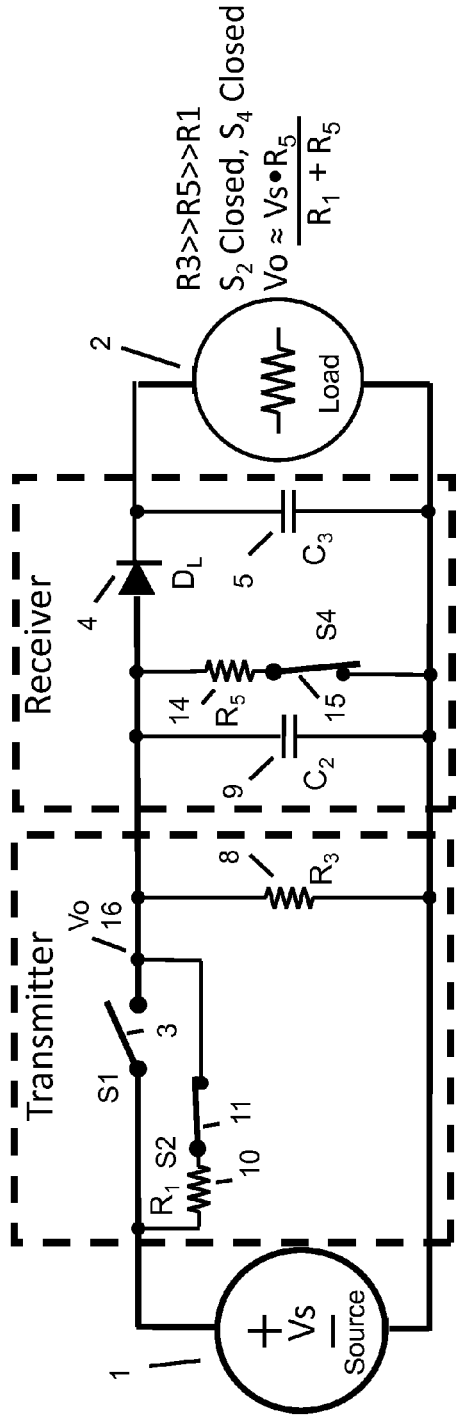
FIG. 4 is an illustration of a digital power system when switches S2 and S4 are closed.

Referring to FIGS. 3 and 4, there is an optimal voltage range to perform the data transmission that is determined by the steady state DC voltage levels that occur when switch (S2) 11 is closed and switch (S4) 15 is open, as in FIG. 3, and when switch (S2) is closed and switch (S4) is also closed, as in FIG. 4. These two states represent all of the previously described conditions where the transmitter 20 is transmitting a logic "1" or "0" to the receiver 21 and where the receiver 21 is transmitting a "1" or "0" to the transmitter 20 circuitry.

Again referring to FIG. 3, the upper side of the voltage range is defined approximately as:

$$V_o \approx V_s \cdot R_3/(R_1+R_3),$$

and the lower side of the range is defined in FIG. 4 approximately as:

$$V_o \approx V_s \cdot R_5/(R_1+R_5).$$

Since the variables in the equations are known in advance by the source controller 18, the transmitter 20 can execute an algorithm in its source controller 18 to select the beginning time for the start of its data transmission based on the expected decay rate in the transmission line voltage. The decay rate is chiefly governed by the line-to-line resistance and line-to-line capacitance. The line-to-line resistance is known in advance as part of the system design and the line-to-line capacitance can be measured by the source controller 20 or load controller 21 by measuring the rate of decay of the transmission line voltage and applying mathematics well known to those skilled in the art for the decay rate of a resistive-capacitive circuit.

8b/9b Encoding of Data Transmission

In telecommunications data transmission, a technique well known to the industry is 8b/9b encoding. 8b/9b encoding is method that maps 8-bit symbols to 9-bit symbols to achieve DC-balance in the physical transmission medium. This means that the difference between the number of logic "1s" and "0s" in the data transmission is kept to a minimum. Because communication protocols, such as Ethernet, use isolation transformers, an imbalance in the number of positive and negative logic states can result in an undesirable DC magnetic flux in the transformer core and reduced performance. There are variations of 8b/9b, such as 8b/10b, that result in closer balance of logic states, albeit at the expense of more bits needed for each symbol.

Methods described herein draw on the concept of 8b/9b encoding for the purpose of optimizing the placement of the data stream within the upper and lower voltage boundaries set by the pull-up/pull-down circuitry described above. More specifically the method employs 8b/9b encoding to create a symbol table that accounts for the known electrical variables in the digital power transmission system to keep the transmission-line voltage during data transmission centered within the upper and lower voltage boundaries. Since the transmission lines are already biased to decay rather than rise during the sample period, the symbol table is set to provide an upward bias in compensation.

Other Embodiments

In existing implementations of packet energy transfer, there are predetermined fault trip-point values for the amount of decay in the transmission line voltage during the sample period. For better sensitivity of line faults where in-line data transmission is being performed, a particular embodiment can include adjusting the fault trip-points based on the amount of change caused in the transmission-line voltage due to the transmission of data. For example, if the line voltage is normally allowed to drop to 300 Vdc before being considered a fault condition, the trip-point can be raised to 310 Vdc to account for a data transmission instance that biased the decay voltage upwards during the sample period.

In another particular embodiment, a single digital power transmitter 20 can communicate with multiple receivers, where each receiver would be programmed with an address code. The data transmission protocol includes the address of the receiver when sending a command if the command involved a particular instruction for that receiver.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties or other values are specified herein for embodiments of the invention, those parameters or values can be adjusted up or down by $1/100^{th}$, $1/50^{th}$, $1/20^{th}$, $1/10^{th}$, $1/5^{th}$, $1/3^{rd}$, $1/2$, $2/3^{rd}$, $3/4^{th}$, $4/5^{th}$, $9/10^{th}$, $19/20^{th}$, $49/50^{th}$, $99/100^{th}$, etc. (or up by a factor of 1, 2, 3, 4, 5, 6, 8, 10, 20, 50, 100, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references may or may not be included in embodiments of this invention. Still further, the components and steps identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A method for communicating data between a digital power transmitter and one or more digital power receivers over a transmission line comprising positive and negative conductors, wherein the transmission line has electrical properties that include at least a finite line-to-line capacitance and at least a finite line-to-line resistance, the method comprising:

a) if the transmitter is sending data to the receiver, selectively operating a first transmitter electrical switch to increase electrical charge in the transmission-line capacitance by connecting the transmission-line to a transmitter voltage source through a finite resistance or by operating a second transmitter electrical switch to decrease electrical charge by connecting the positive and negative conductors of the transmission line to each other through a finite resistance such that a rate of change in transmission-line voltage alternates between a first voltage slope value and a second voltage slope value, wherein a change in voltage slope is detected and decoded by the receiver to reproduce data being sent by the transmitter; and b) if the receiver is sending data to the transmitter, selectively operating a first receiver electrical switch to increase electrical charge in the transmission-line capacitance by connecting the transmission lines to a receiver voltage source through a finite resistance or by operating a second receiver electrical switch to decrease electrical charge by connecting the positive and negative conductors of the transmission line to each other through a finite resistance such that a rate of change in transmission-line voltage alternates between a first voltage slope value and a second voltage slope value, wherein a change in voltage slope is detected and decoded by the transmitter to reproduce data being sent by the receiver.

2. The method of claim 1, wherein the transmitter voltage source is connected to the transmission line through a series resistance small enough to cause a rapid increase in transmission-line voltage, the method further comprising using the detection of the rapid increase by the transmitter or receiver as a timing reference point for setting relative times to sample and determine the voltage slope values that signify logic states.

3. The method of claim 1, wherein, during the time when the receiver is communicating to the transmitter, the transmitter acts to connect the transmission line to the transmitter voltage source through a first resistor value; and a load side simultaneously connects the transmission-line conductors to each other through a second resistor value, thus forming a voltage divider that creates a third voltage slope value that is detected by the transmitter.

4. The method of claim 1, wherein, if the transmitter is sending data to the receiver, only one of the two transmitter electrical switches is implemented such that the rate of change in transmission-line voltage alternates between a first voltage slope value when the one transmitter electrical switch is closed and a second voltage slope value when the one transmitter electrical switch is open, wherein the change in voltage slope is detected and decoded by the receiver to reproduce the data being sent by the transmitter.

5. The method of claim 1, wherein, if the receiver is sending data to the transmitter, only one of the two receiver electrical switches is implemented such that the rate of change in transmission-line voltage alternates between a first voltage slope value when the one receiver electrical switch is closed and a second voltage slope value when the one receiver electrical switch is open, wherein the change in voltage slope is detected and decoded by the transmitter to reproduce the data being sent by the receiver.

6. The method of claim 1, wherein the transmitter or receiver executes an encoding algorithm for a predetermined number of original data bits to be transmitted, wherein an input to the encoding algorithm is the predetermined number of original bits and an output of the algorithm is a larger number of optimized bits that are chosen to maintain the transmission-line voltage between predetermined upper and lower voltage boundaries, and wherein the optimized bits are then decoded at the receiver back to the predetermined number of original bits.

7. The method of claim 1, wherein the transmitter or receiver executes an algorithm to calculate the capacitance of the transmission line based on a measurement of a rate of decay of transmission-line voltage and a predetermined value of line-to-line resistance.

8. The method of claim 7, wherein the calculated capacitance value of the transmission line and the predetermined line-to-line resistance is used as inputs to an algorithm to predict a time when the transmission-line voltage will decay to an optimal value for supporting the transmission of data.

9. The method of claim 1, wherein the transmitter maintains predetermined acceptable values for transmission-line voltage, and wherein voltages outside of the acceptable values indicate a fault condition, and wherein the transmitter executes an algorithm to adjust the acceptable values based on the characteristics of the data transmitted from the transmitter to the receiver or from the receiver to the transmitter.

10. A method for communicating data between a digital power transmitter and one or more digital power receivers over a transmission line comprising positive and negative conductors, wherein the transmission line has electrical properties that include at least a finite line-to-line capacitance and at least a finite line-to-line resistance, the method comprising:

a) if the transmitter is sending data to the receiver, selectively adding electrical charge to the transmission line capacitance by connecting the transmission line to a transmitter power source or subtracting electric charge from the transmission line capacitance by connecting the positive and negative conductors of the transmission line to a transmitter power sink, such that a rate of change in transmission line voltage alternates between a first voltage slope value and a second voltage slope value, wherein a change in voltage slope is detected and decoded by the receiver to reproduce data being sent by the transmitter; and b) if the receiver is sending data to the transmitter, selectively adding electric charge to the transmission-line capacitance by connecting the transmission lines to a receiver power source or by selectively subtracting electric charge from the transmission line capacitance by connecting the conductors to a receiver power sink, such that a rate of change in transmission-line voltage alternates between a first voltage slope value and a second voltage slope value, wherein a change in voltage slope is detected and decoded by the transmitter to reproduce data being sent by the receiver.

11. The method of claim 10, wherein the transmitter power source is connected to the transmission line through a series resistance small enough to cause a rapid increase in transmission-line voltage, the method further comprising using the detection of the rapid increase by the transmitter or receiver as a timing reference point for setting relative times to sample and determine the voltage slope values that signify logic states.

12. The method of claim 10, wherein, during the time when the receiver is communicating to the transmitter, the transmitter acts to connect the transmission line to the transmitter voltage source through a first resistor value; and a load side simultaneously connects the transmission-line conductors to each other through a second resistor value, thus forming a voltage divider that creates a third voltage slope value that is detected by the transmitter.

13. The method of claim 10, wherein, if the transmitter is sending data to the receiver, only one method of either adding or subtracting charge is implemented such that the rate of change in transmission-line voltage alternates between a first voltage slope value when the one method of adding or subtracting charge is implemented and a second voltage slope where charge is not being added or subtracted, wherein the change in voltage slope is detected and decoded by the receiver to reproduce the data being sent by the transmitter.

14. The method of claim 10, wherein, if the receiver is sending data to the transmitter, only one method of either adding or subtracting charge is implemented such that the rate of change in transmission-line voltage alternates between a first voltage slope value when the one method of adding or subtracting charge is implemented and a second voltage slope where charge is not being added or subtracted, wherein the change in voltage slope is detected and decoded by the transmitter to reproduce the data being sent by the receiver.

15. The method of claim 10, wherein the transmitter or receiver executes an encoding algorithm for a predetermined number of original data bits to be transmitted, wherein an input to the encoding algorithm is the predetermined number of original bits and an output of the algorithm is a larger number of optimized bits that are chosen to maintain the transmission-line voltage between predetermined upper and lower voltage boundaries, and wherein the optimized bits are then decoded at the receiver back to the predetermined number of original bits.

16. The method of claim 10, wherein the transmitter or receiver executes an algorithm to calculate the capacitance of the transmission line based on a measurement of a rate of decay of transmission-line voltage and a predetermined value of line-to-line resistance.

17. The method of claim 16, wherein the calculated capacitance value of the transmission line and the predetermined line-to-line resistance is used as inputs to an algorithm to predict the time when the transmission-line voltage will decay to an optimal value for supporting the transmission of data.

18. The method of claim 10, wherein the transmitter maintains predetermined acceptable values for transmission-line voltage, and wherein voltages outside of the acceptable values indicate a fault condition, and wherein the transmitter executes an algorithm to adjust the acceptable values based on the characteristics of the data transmitted from the transmitter to the receiver or from the receiver to the transmitter.

* * * * *

UNITED STATES PATENT AND TRADEMARK OFFICE
CERTIFICATE OF CORRECTION

PATENT NO. : 9,184,795 B2
APPLICATION NO. : 14/604836
DATED : November 10, 2015
INVENTOR(S) : Stephen Spencer Eaves et al.

It is certified that error appears in the above-identified patent and that said Letters Patent is hereby corrected as shown below:

On the title page item (72), should read as follows:

(72) Inventors: Stephen Spencer Eaves, Charlestown, RI (US); Jonathan J. Casey, Warwick, RI (US)

Signed and Sealed this
Twenty-first Day of June, 2016

Michelle K. Lee
*Director of the United States Patent and Trademark Office*